United States Patent
Deng

(10) Patent No.: US 9,640,427 B2
(45) Date of Patent: May 2, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Hao Deng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/941,732

(22) Filed: Nov. 16, 2015

(65) Prior Publication Data

US 2016/0181149 A1   Jun. 23, 2016

(30) Foreign Application Priority Data

Dec. 19, 2014   (CN) .......................... 2014 1 0820269

(51) Int. Cl.
| | |
|---|---|
| *H01L 21/00* | (2006.01) |
| *H01L 21/768* | (2006.01) |
| *H01L 21/4763* | (2006.01) |

(52) U.S. Cl.
CPC .. *H01L 21/76826* (2013.01); *H01L 21/76814* (2013.01); *H01L 21/76831* (2013.01); *H01L 21/4763* (2013.01); *H01L 2924/0002* (2013.01)

(58) Field of Classification Search
CPC ................................................. H01L 21/31116
See application file for complete search history.

(56) References Cited

U.S. PATENT DOCUMENTS

2007/0224824 A1* 9/2007 Chen .................... H01L 21/3105
                                                                              438/700

* cited by examiner

*Primary Examiner* — William Harriston
(74) *Attorney, Agent, or Firm* — Anova Law Group, PLLC

(57) ABSTRACT

A method for forming a semiconductor structure is provided. The method includes providing a substrate; and forming an ultra-low-dielectric-constant (ULK) dielectric layer on a surface of the substrate. The method also includes etching the ultra-low-dielectric-constant dielectric layer to form a trench in the ultra-low-dielectric-constant dielectric layer; and performing an inert plasma treatment process on a side surface of the trench. Further, the method includes performing a carbonization process on the side surface of the trench; and performing a nitridation process on the side surface of the trench to form a SiCNH layer on the side surface of the trench.

20 Claims, 3 Drawing Sheets

US 9,640,427 B2

SEMICONDUCTOR STRUCTURE AND FABRICATION METHOD THEREOF

CROSS-REFERENCES TO RELATED APPLICATIONS

This application claims the priority of Chinese patent application No. 201410820269.4, filed on Dec. 19, 2014, the entirety of which is incorporated herein by reference.

FIELD OF THE INVENTION

The present invention generally relates to the field of semiconductor manufacturing and, more particularly, relates to semiconductor structures and fabrication processes thereof.

BACKGROUND

With the continuous development of the semiconductor integrated circuit (IC) technology, the critical dimension (CD) of semiconductor devices and interconnect structures has become smaller and smaller. Thus, the distances between metal lines of the interconnect structures have been continuously reduced; and the dielectric layer used for isolating the adjacent metal lines has also become thinner and thinner. Accordingly, crosstalk between adjacent metal lines occurs. Reducing the dielectric constant of the dielectric layer is able to effectively reduce the crosstalk between adjacent metal lines. Further, the low dielectric constant (low-K) material is also be able to reduce the RC delay between metal interconnect lines. Thus, the ultra-low-K (ULK) dielectric material has been more and more widely used as the dielectric layer in the metal interconnect structures.

An existing process for forming a metal interconnect structure in a ULK dielectric layer includes forming an ULK dielectric layer on a substrate; etching the ULK dielectric layer to form a trench; and forming the metal interconnect structure in the trench. The metal interconnect structure includes a diffusion barrier layer formed on the side and bottom surfaces of the trench; and a metal layer formed on the diffusion barrier layer.

However, the interface between the ULK dielectric layer and the diffusion barrier layer has certain issues because the roughness of the ULK dielectric layer is relatively high. The relatively high roughness and porous nature of the ULK dielectric layer, especially when the ULK dielectric layer is damaged, may cause the metal atoms of the metal layer to penetrate into the ULK dielectric layer. Thus, the electric performance and reliability of the metal interconnect structure may be degraded.

The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate; and forming an ultra-low-dielectric-constant (ULK) dielectric layer on a surface of the substrate. The method also includes etching the ultra-low-dielectric-constant dielectric layer to form a trench in the ultra-low-dielectric-constant dielectric layer; and performing an inert plasma treatment process on side surface of the trench. Further, the method includes performing a carbonization process on the side surface of the trench; and performing a nitridation process on the side surface of the trench to form a SiCNH layer on the side surface of the trench.

Another aspect of the present disclosure includes a semiconductor structure. The semiconductor structure includes a substrate; and a first metal interconnect structure formed on the substrate. The semiconductor structure also includes an ultra-low-dielectric-constant (ULK) dielectric layer formed on the surface of the substrate; and a diffusion barrier layer formed in the ultra-low-dielectric-constant dielectric layer and on the first metal interconnect structure; a SiCNH layer formed around a side surface of the diffusion barrier layer; and a metal layer formed on the diffusion barrier layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The performance and reliability of the metal interconnect structure formed in the ULK dielectric layer may be need further improvements. For example, the time dependent dielectric breakdown (TDDB) performance that is related with breakdown voltage and time may be affected by the high roughness of the ULK dielectric layer. Thus, the roughness of the surface of the ULK dielectric layer connecting with the metal interconnect structure may need to be reduced.

During a plasma etching process for forming a trench in the ULK dielectric layer, the damage caused by the plasma may convert a portion of the Si—$CH_3$ bonds in the ULK dielectric layer to Si—OH bonds. Thus, the flatness and roughness of the side surfaces of trench may be unacceptable. When the diffusion barrier layer is formed on the side and bottom surfaces of the trench, the flatness and roughness of the diffusion barrier layer may also be unacceptable. Thus, the diffusion barrier layer may be unable to prevent the metal atoms in the metal layer from diffusing into the ULK dielectric layer. Therefore, the stability and electrical performance of the metal interconnect structure may be adversely affected.

Figure 1:
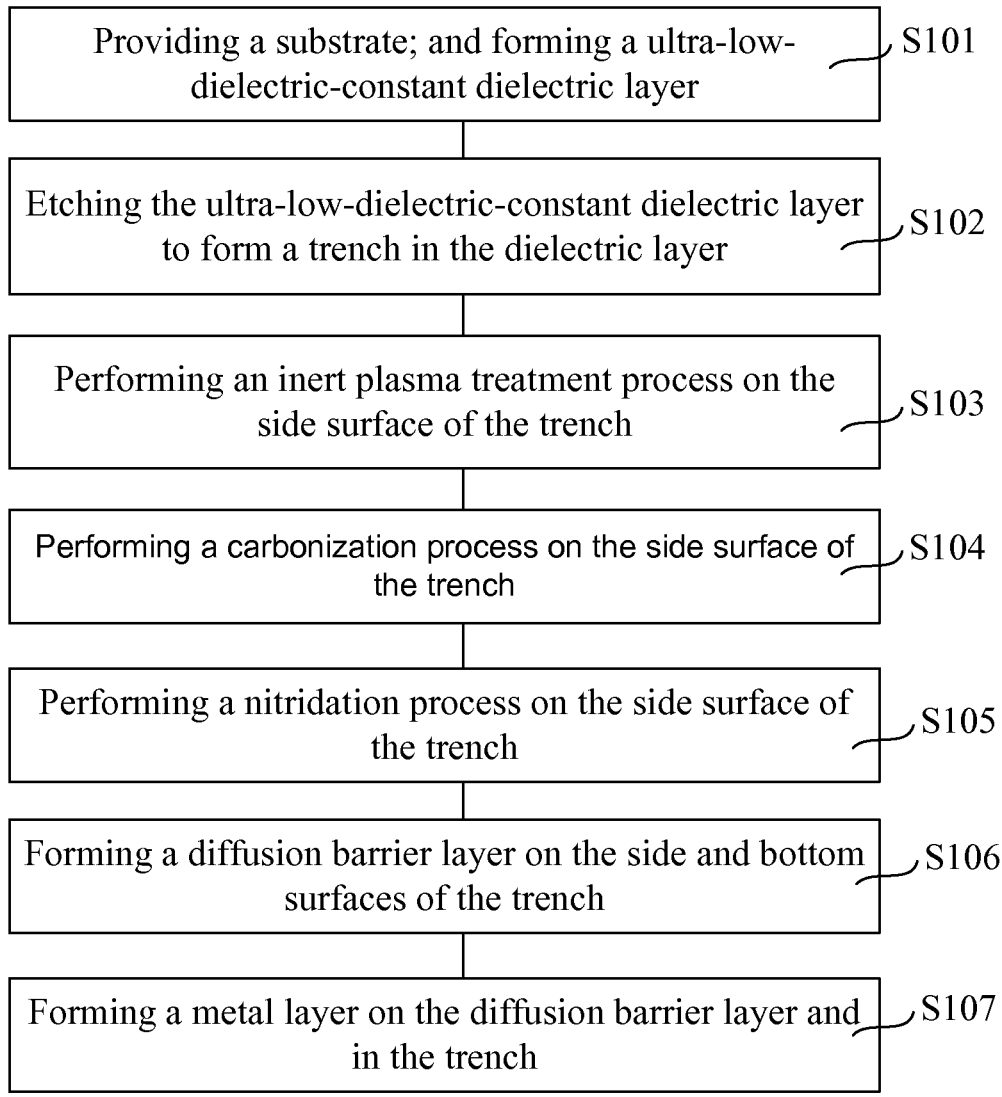
FIG. 1 illustrates an exemplary fabrication process of a semiconductor structure consistent with the disclosed embodiments.

FIG. 1 illustrates an exemplary fabrication process of a semiconductor structure consistent with the disclosed embodiments. FIGS. 2~8 illustrate semiconductor structures corresponding certain stages of the exemplary fabrication process.

Figure 2:
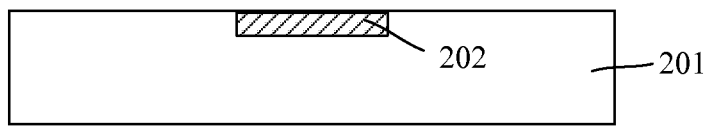
FIGS. 2~8 illustrate semiconductor structures corresponding to certain stages of an exemplary fabrication process of a semiconductor structure consistent with the disclosed embodiments.

As show in FIG. 1, at the beginning of the fabrication process, a substrate with certain structures is provided (S101). FIG. 2 illustrates a corresponding semiconductor structure.

As shown in FIG. 2, a substrate 201 in provided. Further, a first metal interconnect structure 202 may be formed over the substrate 201. The substrate 201 provides a base for subsequent devices and processes. The first metal interconnect structure 202 may include meal layers, conductive material layers, and metal vias, etc.

In one embodiment, the substrate 201 may include a semiconductor substrate and a dielectric layer formed on the semiconductor substrate. The semiconductor substrate may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor or a combination thereof.

Semiconductor devices, such as transistors, etc., may be formed in the semiconductor substrate. The dielectric layer may be formed on the semiconductor substrate; and the first metal interconnect structure 202 may be formed in the dielectric layer. The metal interconnect structure 202, including metal conductive vias, etc., may be electrically connected with the semiconductor devices.

In certain other embodiments, the substrate 201 may be a dielectric layer. The first metal interconnect structure 202 may be formed in the dielectric layer 202. The first metal interconnect structure 202 may be metal lines, or metal conductive vias, etc.

Figure 3:
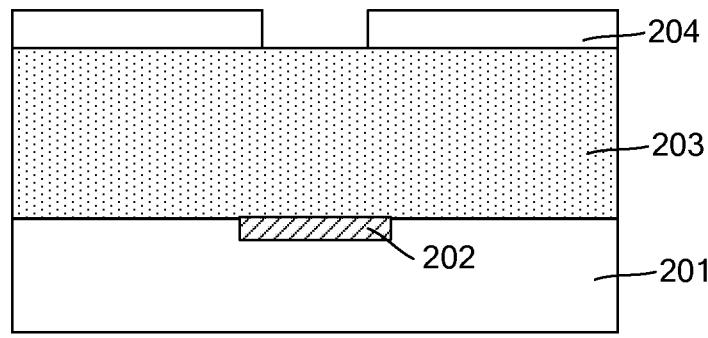

A shown in FIG. 3, after providing the substrate 201, and forming the first metal interconnect structure 202, an ultra-low-dielectric-constant (ULK) dielectric layer 203 may be formed on the substrate 201 and the metal interconnect structure 202. Further, a patterned mask layer 204 may be formed on the ULK dielectric layer 203.

The ULK dielectric layer 203 may be made of any appropriate material. In one embodiment, the ULK dielectric layer 203 may include silicon element, carbon element, hydrogen element, and oxygen element, etc. The ULK dielectric layer 203 may have Si—$CH_3$ bonds. The dielectric constant of the ULK dielectric layer 203 may be smaller than approximately 3.0.

Various processes may be used to form the ULK dielectric layer 203, such as a chemical vapor deposition (CVD) process, a physical vapor deposition (PVD) process, a flowable CVD (FCVD) process, or a sol-gel process, etc. In one embodiment, a process for forming the ULK dielectric layer 203 may include introducing a precursor, a pore-making agent and oxygen into a reaction chamber to form a ULK dielectric film after a reaction; and followed by an UV treatment process to remove the pore-making agent. Thus, pores may be formed in the ULK dielectric film; and the ULK dielectric layer 203 may be formed.

The precursor may include tetraethyl orthosilicate, methyldiethoxysilane, dirthoxydimethylsilan, or methyltriethoxysilane, etc. The pore-making agent may include α-terpinene, or dicycloheptadiene, etc.

After forming the ULK dielectric layer 203, the patterned mask layer 204 may be formed on the ULK dielectric layer 203. The patterned mask layer 204 may include an opening (not labeled) exposing the surface of the ULK dielectric layer 203. The patterned mask layer 204 may be used as a mask layer for subsequently etching the ULK dielectric layer 203.

The patterned mask layer 204 may be a single layer structure, or a multiple-layer stacked structure. The patterned mask layer 204 may be a photoresist layer, or a hard mask layer, etc.

Figure 4:
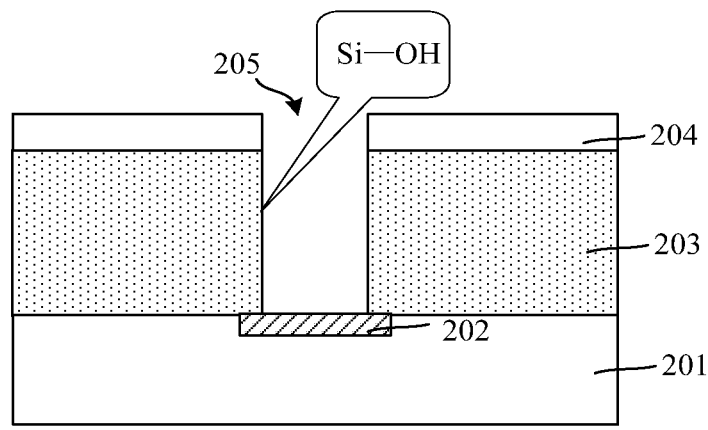

Returning to FIG. 1, after forming the ULK dielectric layer 203 and the patterned mask layer 204, a trench may be formed (S102). FIG. 4 illustrates a corresponding semiconductor structure.

As shown in FIG. 4, a trench 205 is formed in the ULK dielectric layer 203; and the surface of the first metal interconnect structure 202 may be exposed by the trench 205. The trench 205 may be formed by etching the ULK dielectric layer 203 using the patterned mask layer 204 as an etching mask until the surface of the first metal interconnect structure 202 is exposed. The side surface of the trench 205 may have Si—OH bonds. The Si—OH bonds may be converted from the Si—$CH_3$ bonds during the etching process for forming the trench 205.

The ULK dielectric layer 203 may be etched by any appropriate process, such as a dry etching process, a wet etching process, or an ion beam etching process, etc. In one embodiment, a plasma etching process is used to etch the ULK dielectric layer 203 to form the trench 205. The etching gas of the plasma etching process may any appropriate gas. In one embodiment, the etching gas is $C_2F_6$.

During the plasma etching process, the high-energy plasma may cause the —$CH_3$ function groups of the Si—$CH_3$ bonds on the side surface of the trench 205 to be di-bonded from the Si atoms. Thus, Si suspending bonds may be formed. The Si suspending bonds may be easy to form Si—OH bond with H element and O element in the plasma. Because the Si—$CH_3$ bonds may be relatively weak, under the etching plasma, Si—$CH_3$ bond may be easily broken to form Si suspending bonds. The Si suspending bonds may cause the surface of the trench 205 to be hydrophilic; and it may be easy to form the Si—OH bonds.

The trench 205 may be a rectangular trench, a "U"-shaped trench, or a "V"-shaped trench, etc. In one embodiment, the trench 205 is a rectangular trench.

In certain other embodiments, the trench 205 may be a Damascene trench. The Damascene trench may include a through-hole in the ULK dielectric layer 203, and an opening on the top of the through-hole. The opening and the through-hole may penetrate through each other.

Figure 5:
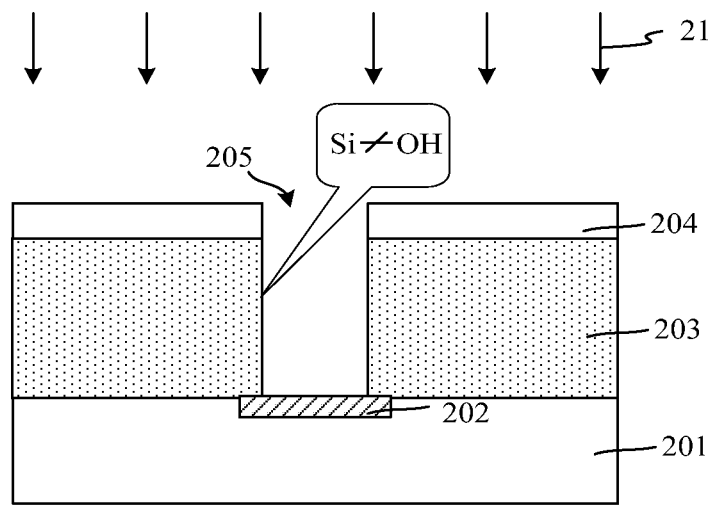

Returning to FIG. 1, after forming the trench 205, an inert plasma treatment process may performed (S103). FIG. 5 illustrates a corresponding semiconductor structure.

As shown in FIG. 5, an inert plasma treatment process 21 may be performed on the side surface of the trench 205, i.e., the side surface of the ULK dielectric layer 202 exposed by the side surface of the trench 205. The inert plasma treatment process 21 may break the —OH function groups from the Si—OH bonds; and form Si suspending bonds (Si—) on the surface of the ULK dielectric layer 203 exposed by the side surface of the openings 205. That is, the inert plasma treatment may be performed to break Si—OH bonds at the surface ULK dielectric layer 202 exposed by the side surface of the trench 205.

The inert plasma treatment process 21 may utilize a high-energy inert plasma to break the OH function groups from the Si—OH bonds. Thus, the Si suspending bonds may be formed after the inert plasma treatment process 21.

The inert plasma of the inert plasma treatment process 21 may be a He plasma, an N plasma, or an Ar plasma, etc. Because the inert plasma may be non-conductive, the insulation properties of the ULK dielectric layer 203 may not be affected after the inert plasma treatment process. Further, because the inert gas may be inactive, it may not bond with the silicon suspending bonds.

In one embodiment, an Ar plasma is used in the inert plasma treatment process. The gas of the inert plasma treatment process is Ar. The flow rate of Ar may be in a range of approximately 200 sccm~2000 sccm. The high-frequency radio-frequency power of the plasma may be in a range of approximately 0~200 W. The low-frequency radio-frequency power of the plasma may be in a range of approximately 200 W~2000 W. The pressure of the plasma chamber may be in a range of approximately 5 Torr~10 Torr. The temperature of the inert plasma treatment process may be in a range of approximately 250° C.~400° C.

Figure 6:
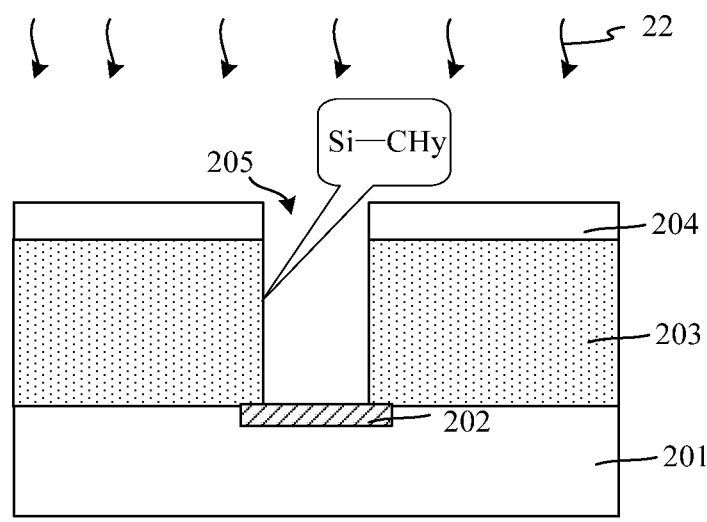

Returning to FIG. 1, after performing the inert plasma treatment process, a carbonization process may be performed (S104). FIG. 6 illustrates a corresponding semiconductor structure.

As shown in FIG. 6, a carbonization process 22 is performed on the side surface of the trench 205. After the carbonization process, the Si suspending bonds may be converted into Si—$CH_y$ bonds ($0<y\leq3$); and a SiCH film (not shown) may be formed on the side surface of the trench 205.

The carbonization process may a carbon and hydrogen-containing plasma process. The gas of the carbonization process may include trimethylsilane, or tetramethylsilane, etc. The flow rate of the gas may be in a range of approximately 200 sccm~2000 sccm. The high-frequency radio-frequency power of the plasma may be in a range of approximately 0~200 W. The low-frequency radio-frequency power of the plasma may be in a range of approximately 200 W~2000 W. The pressure of the plasma chamber may be in a range of approximately 5 Torr~10 Torr. The temperature of the carbonization process may be in a range of approximately 250° C.~400° C.

The trimethylsilane, or the tetramethylsilane may be ionized into a carbon plasma, a hydrogen plasma, and a carbon-hydrogen plasma, etc. The carbon plasma, hydrogen plasma, and carbon-hydrogen plasma may be easy to react with the Si suspending bonds to form the Si—$CH_y$ bonds ($(0<y\leq3)$).

Figure 7:
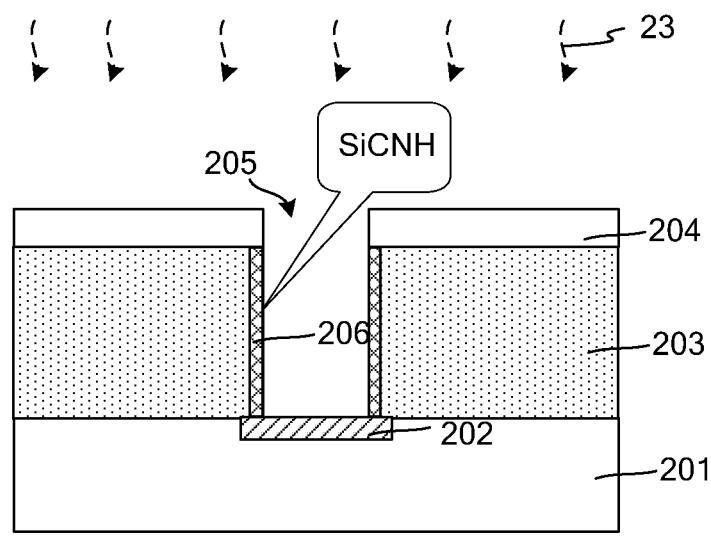

Returning to FIG. 1, after the carbonization process 22, a nitridation process may be performed (S105). FIG. 7 illustrates a corresponding semiconductor structure.

As shown in FIG. 7, a nitridation process 23 is performed on the side surface of the trench 205. The nitridation process may convert the Si—$CH_y$ bonds into Si—CNH bonds; and a SiCNH layer 206 may be formed on the side surface of the trench 205.

The nitridation process may be a nitrogen-containing plasma treatment process. The gas of the nitridation process may include one or more of $NH_3$, and $N_2$, etc. That is, the gas of the nitridation process may include nitrogen gas, or may include nitrogen-hydrogen gas. The flow rate of the gas may be in a range of approximately 200 sccm~2000 sccm. The high-frequency radio-frequency power of the plasma may be in a range of approximately 0~200 W. The low-frequency radio-frequency power of the plasma may be in a range of approximately 200 W~2000 W. The pressure of the plasma chamber may be in a range of approximately 5 Torr~10 Torr. The temperature of the nitridation process may be in a range of approximately 250° C.~400° C. The thickness of the SiCNH layer 206 after the nitridation process may be in a range of approximately 20 Å~100 Å.

After the inert plasma treatment process 21, the carbonization process 22, and the nitridation process 23, the Si—OH bonds on the side surface of the trench 205 caused by the damaging of the plasma etching process may be removed; and the SiCNH layer 206 may be formed on the side surface of the trench 205. The roughness of the side surface of the ULK dielectric layer 203 exposed by the trench 205 may be reduced. Thus, a desired interface morphology for subsequently forming a diffusion barrier layer may be obtained.

To further improve the effect for reducing the surface roughness of the ULK dielectric layer dielectric 203 exposed by the trench 205, the inert plasma treatment process 21, the carbonization process 22, and the nitridation process 23 may be sequentially repeated with a pre-determined number of cycles. In one embodiment, the inert plasma treatment process 21, the carbonization process 22, and the nitridation process 23 are sequentially repeated for 2~10 cycles. The roughness of the side surface of the ULK dielectric layer 203 may be measured to determine the number of cycles to be performed.

Figure 8:
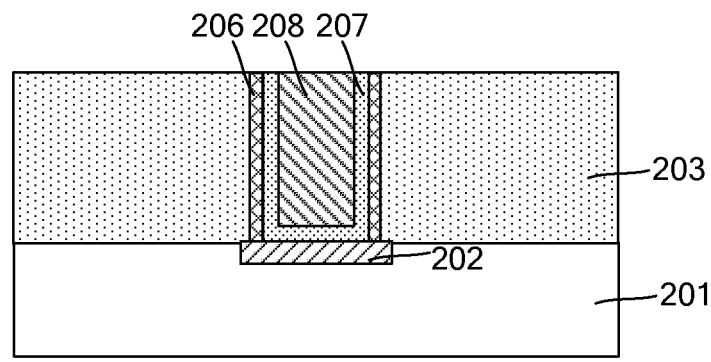

Returning to FIG. 1, after performing the nitridation process 23, a diffusion barrier layer may be formed (S106). FIG. 8 illustrates a corresponding semiconductor structure.

As shown in FIG. 8, a diffusion barrier layer 207 is formed on the side surface and bottom surface of the trench 205. That is, the diffusion barrier layer 207 may be formed on the SiCNH layer 206 and the surface of the interconnect structure 202.

The diffusion barrier layer 207 may a single layer structure, or a multiple-layer structure. The diffusion barrier layer 207 may be made of any appropriate material, such as one or more of Ti, Ta, TiN, and TaN, etc.

In one embodiment, the diffusion barrier layer 207 may be a double-layer structure. Referring to FIG. 8, the diffusion barrier layer 207 may include a TiN layer (not shown) formed on the side surface and the bottom surface of the trench 205 and a Ti layer (not shown) formed on the TiN layer. In certain other embodiments, the diffusion barrier may include a TaN layer formed on the side surface and the bottom surface of the trench 205, and a Ta layer formed on the TaN layer.

The diffusion barrier layer 207 may be formed by any appropriate process, such as a CVD process, a PVD process, or an ALD process, etc. In one embodiment, the diffusion barrier layer 207 is formed by a sputtering process.

Returning to FIG. 1, after forming the diffusion barrier layer 207, a metal layer may be formed (S107). FIG. 8 also illustrates a corresponding semiconductor structure.

As shown in FIG. 8, after forming the diffusion barrier layer 207, a metal layer 208 is formed on the diffusion barrier layer 207; and the metal layer 208 may fill the trench 205. The metal layer 208 and the diffusion barrier layer 207 may be referred as a second metal interconnect structure. The metal layer 208 may be made of any appropriate material, such as Cu, Al, or W, etc.

A process for forming the metal layer 208 and the diffusion barrier layer 207 may include forming a barrier diffusion material film on the side surface and the bottom surface of the trench 205 and the surface of the patterned mask layer 204; forming a metal material layer filling the trench 205 on the barrier material film; and removing the portion of the metal material layer over the patterned mask layer 204, the portion of the barrier material film on the patterned mask layer 204, and the patterned mask layer 204. Thus, the diffusion barrier layer 207 may be formed on the side surface and the bottom surface of the trench 205. That is, the diffusion barrier layer 207 may be formed on the SiCNH layer 206 and the surface of the first metal interconnect structure 202. Further, the metal layer 208 may be formed on the diffusion barrier layer 207.

The diffusion barrier material film may be formed by any appropriate process, such as a CVD process, a PVD process, or an FCVD process, etc. The metal material layer may be formed by any appropriate process, such as a CVD process, a PVD process, an FCVD process, an electroplating process, or a chemical plating process etc.

The portion of the metal material layer over the mask layer 203, the portion of the barrier material film on the mask layer 203, and the mask layer 203 may be removed by any appropriate process. In one embodiment, the portion of the metal material layer over the mask layer 203, the portion of the barrier material film on the mask layer 203, and the mask layer 203 are removed by a CMP process.

Thus, a semiconductor structure may be formed by the above disclosed processes and methods; and the corresponding semiconductor structure is illustrated in FIG. 8. As shown in FIG. 8, the semiconductor structure includes a substrate 201; and a first metal interconnect structure 202 formed on the substrate 201. The semiconductor structure may also include an ULK dielectric layer 203 formed on the surface of the substrate 300; and a trench (not labeled) exposing the surface of the first metal interconnect structure 202 formed in the ULK dielectric layer 203. Further, the semiconductor structure may also include a SiCNH layer 206 formed on the side surface of the trench; and a diffusion barrier layer 207 formed on the surface of the SiCNH layer 206 and the surface of the first metal interconnect structure 202. Further, the semiconductor structure may also include a metal layer 208 formed on the diffusion barrier layer 207. The detailed structures and intermediate structures are described above with respect to the fabrication processes.

According to the disclosed methods and structures, after forming a trench in the ULK dielectric layer by etching the ULK dielectric layer, an inert plasma treatment process, a carbonization process, and a nitridation process may be sequentially performed to remove the Si—OH bonds on the side surface of the trench; and a SiCNH layer may be formed on the side surface of the trench. The surface roughness of the ULK dielectric layer exposed by the side surface of the trench may be reduced; and a desired interfacial morphology may obtained for subsequently forming a diffusion barrier layer. Thus, the surface flatness of the diffusion barrier layer exposed by the side surface of the trench may be improved; and the stability and performance of metal interconnect structure formed in the trench may be improved. Accordingly, the stability of and the performance of the semiconductor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
providing a substrate;
forming an ultra-low-dielectric-constant (ULK) dielectric layer on a surface of the substrate;
etching the ultra-low-dielectric-constant dielectric layer to form a trench in the ultra-low-dielectric constant material layer;
performing an inert plasma treatment process on a side surface of the trench;
performing a carbonization process on the side surface of the trench; and
after performing the carbonization process, performing a nitridation process on the side surface of the trench to form a carbonized-nitridized layer on the side surface of the trench.

2. The method according to claim 1, wherein:
a plasma of the inert plasma treatment process is one of a He plasma, an Ne plasma and an Ar plasma and is configured to break Si—OH bond.

3. The method according to claim 2, wherein:
the inert plasma of the inert plasms treatment process is the Ar plasma;
a gas of the inert plasma is Ar;
a flow rate of Ar is in a range of approximately 200 sccm~2000 sccm;
a high-frequency radio-frequency power of the Ar plasma is in a range of approximately 0~200 W;
a low-frequency radio-frequency power of the Ar plasma is in a range of approximately 200 W~2000 W;
a pressure of a plasma chamber is in a range of approximately 5 Torr~10 Torr; and
a temperature of the inert gas treatment process is in a range of approximately 250° C.~400° C.

4. The method according to claim 1, wherein:
the carbonization process is a carbon and hydrogen containing plasma treatment process;
a gas of the carbonization process includes one of trimethylsilane and tetramethylsilane;
a flow rate of the gas is in a range of approximately 200 sccm~2000 sccm;
a high-frequency radio-frequency power of the plasma is in a range of approximately 0~200 W;
a low-frequency radio-frequency power of the plasma is in a range of approximately 200 W~2000 W;
a pressure of a plasma chamber is in a range of approximately 5 Torr~10 Torr; and
a temperature of the carbonization process is in a range of approximately 250° C.~400° C.

5. The method according to claim 1, wherein:
the nitridation process is a nitrogen-containing plasma treatment process;
a gas for the nitrogen-containing plasma treatment process includes one or more of $NH_3$ and $N_2$;
a flow rate of the gas is in a range of approximately 200 sccm~2000 sccm;
a high-frequency radio-frequency power of the plasma is in a range of approximately 0~200 W;
a low-frequency radio-frequency power of the plasma is in a range of approximately 200 W~2000 W;
a pressure of a plasma chamber is in a range of approximately 5 Torr~10 Torr; and
a temperature of the nitridation process is in a range of approximately 250° C.~400° C.

6. A method for fabricating a semiconductor structure, comprising:
providing a substrate;
forming an ultra-low-dielectric-constant (ULK) dielectric layer on a surface of the substrate;
etching the ultra-low-dielectric-constant dielectric layer to form a trench in the ultra-low-dielectric constant material layer;
performing an inert plasma treatment process on a side surface of the trench;
performing a carbonization process on the side surface of the trench;
performing a nitridation process on the side surface of the trench to form a SiCNH layer on the side surface of the trench; and sequentially repeating performing the inert plasma treatment process, performing the carbonization process, and performing the nitridation process for a predetermined number of cycles.

7. The method according to claim 6, wherein:
a number of the cycles is in a range of approximately 2~10.

8. The method according to claim 1, further comprising:
forming a diffusion barrier layer on side and bottom surfaces of the trench; and
forming a metal layer on the diffusion barrier layer in the trench.

9. The method according to claim 8, wherein:
the diffusion barrier layer is formed by a sputtering process.

10. The method according to claim 1, wherein;
the trench is one of a rectangular trench and a Damascene trench.

11. The method according to claim 1, wherein forming the ultra-low-dielectric-constant dielectric layer further comprises:
forming an ultra-low-dielectric-constant dielectric film by a reaction of a precursor, a pore-making agent and oxygen introduced into a chamber; and
performing an UV treatment process on the ultra-low-dielectric-constant dielectric film to remove the pore-making agent and form pores.

12. The method according to claim 11, wherein:
the precursor includes one of tetraethylorthosilicate, methyldiethoxysilane, dirthoxydimethylsilan, and methyltriethoxysilane.

13. The method according to claim 11, wherein:
the pore-making agent includes one of α-terpinene and dicycloheptadiene.

14. A semiconductor structure, comprising:
a substrate;
a first metal interconnect structure formed on a surface the substrate;
an ultra-low-dielectric-constant dielectric layer formed on the surface of the substrate;
a metal layer formed in the ultra-low-dielectric-constant dielectric layer and on the first metal interconnect structure;
a diffusion barrier layer formed on surfaces of sidewalls and bottom of the metal layer, in the ultra-low-dielectric-constant dielectric layer, and on the first metal interconnect structure; and
a carbonized-nitridized layer of the ultra-low-dielectric-constant dielectric layer, on sidewall surfaces of the diffusion barrier layer and on the first metal interconnect structure.

15. The semiconductor structure according to claim 14, wherein the carbonized-nitridized layer includes a SiCNH layer formed by:
etching the ultra-low-dielectric-constant dielectric layer to form a trench in the ultra-low-dielectric-constant dielectric layer;
performing an inert plasma treatment process on a side surface of the trench;
performing a carbonization process on the side surface of the trench; and
performing a nitridation process on the side surface of the trench.

16. The semiconductor structure according to claim 14, wherein:
the ultra-low-dielectric-constant dielectric layer includes silicon, carbon, hydrogen and oxygen.

17. The semiconductor structure according to claim 14, wherein:
a dielectric constant of the ultra-low-dielectric-constant dielectric layer is smaller than three.

18. The semiconductor structure according to claim 14, wherein:
the diffusion barrier layer is made of one or more of Ti, Ta, TiN, and TaN.

19. The semiconductor structure according to claim 14, wherein:
the metal layer is made of one of Cu, Al, and W.

20. The semiconductor structure according to claim 14, wherein the substrate further comprises:
a semiconductor substrate; and
a dielectric layer formed on a surface of the semiconductor substrate.

* * * * *